United States Patent
Broekaert

[19]
[11] Patent Number: 6,037,819
[45] Date of Patent: Mar. 14, 2000

[54] HIGH FREQUENCY CLOCK SIGNAL GENERATOR

[75] Inventor: Tom P. E. Broekaert, Dallas, Tex.

[73] Assignee: Texas Instruments Incorporated, Dallas, Tex.

[21] Appl. No.: 09/126,627

[22] Filed: Jul. 30, 1998

Related U.S. Application Data

[60] Provisional application No. 60/054,456, Aug. 1, 1997.

[51] Int. Cl.[7] .......................................................... G06F 1/04
[52] U.S. Cl. .......................... 327/291; 327/169; 327/499; 327/583
[58] Field of Search ...................................... 327/165, 169, 327/291, 293, 294, 295, 296, 297, 298, 299, 493, 494, 499, 583

[56] References Cited

U.S. PATENT DOCUMENTS

| | | | |
|---|---|---|---|
| 3,603,818 | 9/1971 | White | 307/206 |
| 4,518,921 | 5/1985 | Logan | 328/151 |
| 5,339,053 | 8/1994 | Lux et al. | 331/99 |
| 5,698,997 | 12/1997 | Williamson, III et al. | 326/143 |
| 5,815,008 | 9/1998 | Williamson, III et al. | 326/134 |
| 5,825,240 | 10/1998 | Geis et al. | 327/570 |

*Primary Examiner*—Jeffrey Zweizig
*Attorney, Agent, or Firm*—Christopher L. Maginniss; W. James Brady III; Frederick J. Telecky, Jr.

[57] ABSTRACT

A high frequency clock signal generator (10) is disclosed. The clock signal generator includes a power supply (12, 14), a first resonant tunneling diode (18) coupled to a first terminal of the power supply and an output node (22), and a second resonant tunneling diode (20) coupled to the output node (22) and a second terminal of the power supply. A signal source is coupled to the output node (22) and periodically switches the first and second resonant tunneling diodes (18, 20) between a first state and a second state. The signal source comprises an oscillating signal generator (26) and a transmission line (28) coupled to the output node (22) of the clock signal generator. The oscillating signal generator (26) produces an oscillating input signal, which is reflected by the transmission line (28). The resonant tunneling diode configuration provides rapid voltage swings at the output, thus allowing the generation of a high frequency clock signal of 25 GHz or more.

15 Claims, 2 Drawing Sheets

6,037,819

HIGH FREQUENCY CLOCK SIGNAL GENERATOR

This application claims priority under 35 USC § 119(e)(1) of provisional application Ser. No. 60/054,456 filed Aug. 1, 1997.

TECHNICAL FIELD OF THE INVENTION

This invention relates generally to the field of digital signal processing, and more particularly to a high-frequency clock signal generator.

BACKGROUND OF THE INVENTION

In the art of digital signal processing, a clock signal is typically used to synchronize the activities of various signal processing components. This clock signal typically comprises a square wave with a constant frequency.

As processing speeds increase, higher frequency clock signals become necessary. The frequency range of transistor-based clock signal generators is limited by the switching speed of the transistors used. For some applications, clock frequencies beyond the range of transistor-based clock signal generators may be desirable.

SUMMARY OF THE INVENTION

Therefore, a need has arisen for a clock signal generator that addresses the disadvantages and deficiencies of the prior art.

A high frequency clock signal generator is disclosed. The clock signal generator includes a power supply, a first resonant tunneling diode coupled to a first terminal of the power supply and an output node, and a second resonant tunneling diode coupled to the output node and a second terminal of the power supply. A signal source is coupled to the output node and periodically switches the first and second resonant tunneling diodes between a first state and a second state. In one embodiment, the signal source comprises an oscillating signal generator and a transmission line coupled to the output node of the clock signal generator. The oscillating signal generator produces an oscillating input signal, which is reflected by the transmission line.

A technical advantage of the present invention is that the resonant tunneling diode configuration provides rapid voltage swings at the output, thus allowing the generation of a high frequency clock signal of 25 GHz or more. Another technical advantage is that the clock signal generator may easily be synchronized with an off-chip clock. Another technical advantage is that the clock signal generator may be implemented in a track-and-hold circuit to provide high frequency signal sampling. Another technical advantage is that the high frequency clock signal may be easily immunized from noise effects by generating a complementary clock signal.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
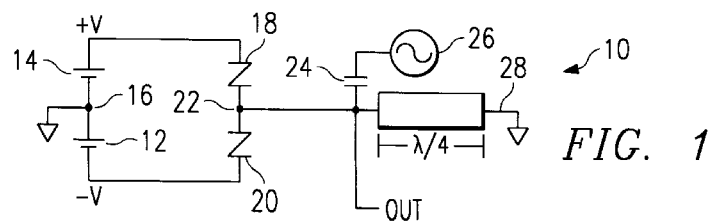
FIG. 1 is a schematic diagram of a first clock signal generator circuit constructed in accordance with the present invention.

Referring to FIG. 1, a clock signal generator circuit 10 in accordance with the present invention is shown. Circuit 10 includes two DC power sources 12 and 14 connected in series. Between power sources 12 and 14 is a node 16 which is grounded. Two resonant tunneling diodes (RTDS) 18 and 20 are connected in series with power sources 12 and 14.

It will be understood that the DC circuit described thus far has two stable states, due to the well-known properties of RTDs. Specifically, if power sources 12 and 14 each generate a DC voltage (V), then one RTD 18 or 20 will have a voltage drop of V+$\Delta$, while the other RTD will have a voltage drop of V−$\Delta$, where the magnitude of $\Delta$ depends on the characteristics of RTDs 18 and 20 and the magnitude of V. An output node 22 between RTDs 18 and 20 therefore assumes a stable potential of either +$\Delta$ or −$\Delta$. When initially connected, circuit 10 will assume one of the two stable states and will maintain that state until disturbed.

A capacitor 24 and AC signal generator 26 are connected to output node 22. Signal generator 26 may be a local constant-frequency oscillator used to set the frequency of clock signal generator circuit 10. Alternatively, if clock signal generator circuit 10 is to be used to synchronize a clock signal on a chip with an external clock signal, signal generator 26 may be an off-chip clock signal generator. In either case, signal generator 26 generates an oscillating output with wavelength $\lambda$ and period T.

Also connected to node 22 is a shielded transmission line 28 which is grounded at its terminus. Transmission line 28 preferably has an overall length equal to $\lambda/4$, or a quarter of the wavelength of the signal generated by signal generator 26. Alternatively, transmission line 28 may have a length equal to an odd integer multiple of $\lambda/4$. For example, it will be understood from the following description that a transmission line having a length of $3\lambda/4$ might also be used.

Capacitor 24 transmits positive and negative voltage swings from signal generator 26 to node 22. These voltage swings are also transmitted by transmission line 28 and are reversed and reflected at the far end. Thus, each voltage swing at node 22 generates a reflected voltage swing in the opposite direction half a period (T/2) later. Transmission line 28 therefore serves to amplify the voltage swings generated by signal generator 26.

When node 22 experiences a voltage swing of sufficient magnitude, RTDs 18 and 20 will switch from their initial stable state to the other stable state. Node 22 will therefore switch from a potential of +$\Delta$ to −$\Delta$ or vice versa. This voltage drop or increase generates an impulse which is also reversed and reflected by transmission line 28. The reflected impulse, coupled with the impulse from signal generator 26, causes RTDs 18 and 20 to switch back to their initial state half a period (T/2) later. This cycle continues, with node 22 oscillating between the two stable-state voltages at a constant frequency, with wavelength $\lambda$ and period T.

It will be appreciated that the voltage transition at node 22 caused by a change of state in RTDs 18 and 20 is very rapid, and that the resulting output signal at node 22 is a square wave. Circuit 10 may therefore be used to generate a very high frequency clock signal, for example with a frequency of 25 GHz or higher.

Although circuit 10 is capable of generating a very high frequency clock signal, the output signal is unipolar and is therefore both susceptible to noise and dependent upon local ground. A more useful signal would be bipolar, or differential, in nature.

Figure 2:
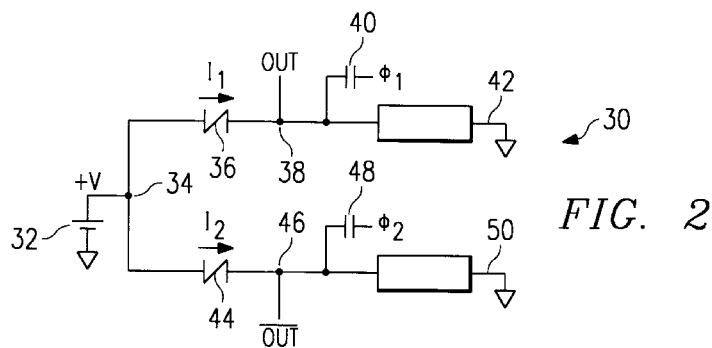
FIG. 2 is a schematic diagram of a second clock signal generator circuit constructed in accordance with the present invention.

Referring to FIG. 2, a second clock signal generator circuit 30 in accordance with the present invention is shown. Circuit 30 includes a DC power source 32 connected between ground and a node 34. Power source 32 generates a constant voltage (V) at node 34.

A first RTD 36 is connected between node 34 and an output node 38. Also connected to node 38 are a capacitor 40 and a shielded transmission line 42 which is grounded at its terminus. Capacitor 40 receives a constant-frequency oscillating signal $\phi_1$ from a sine-wave oscillator or off-chip clock generator, as previously described with respect to circuit 10.

Likewise, a second RTD 44, with the same characteristics as RTD 36, is connected between node 34 and an output node 46. Also connected to node 46 are a capacitor 48 and a shielded transmission line 50 which is grounded at its terminus. Capacitor 48 receives a constant-frequency oscillating signal $\phi_2$, which is the complement of $\phi_1$. Signals $\phi_1$ and $\phi_2$ are therefore 180° out of phase.

Each transmission line 42 and 50 has a length equal to one-quarter of the wavelength of $\phi_1$ and $\phi_2$. Transmission lines 42 and 50 may both be grounded as previously described. Alternatively, transmission lines 42 and 50 may be tied together as will be described more fully below in connection with FIG. 3A.

The voltage V produced by power source 32 is preferably in or near the negative-resistance regions of RTDs 36 and 44. Thus, the oscillating signal $\phi_1$ causes RTD 36 to alternate between the stable states on either side of its negative-resistance region. The current $I_1$ conducted by RTD 36 therefore oscillates in a square-wave fashion, as does the voltage drop across RTD 36.

Likewise, signal $\phi_2$ causes RTD 44 to oscillate between stable states. The oscillation of RTD 44 is 180° out of phase with the oscillation of RTD 36. Thus, although the current conducted by each RTD oscillates in a square-wave fashion, the total current $I_1+I_2$ conducted by RTDs 36 and 44 remains constant. At node 38, a square-wave output signal (OUT) is generated. At node 46, a complementary square-wave output signal ($\overline{OUT}$) is generated. These two signals, when paired together, constitute a bipolar, noise-immune clock signal which may be used for a variety of purposes, either on-chip or off-chip.

Figure 3A:
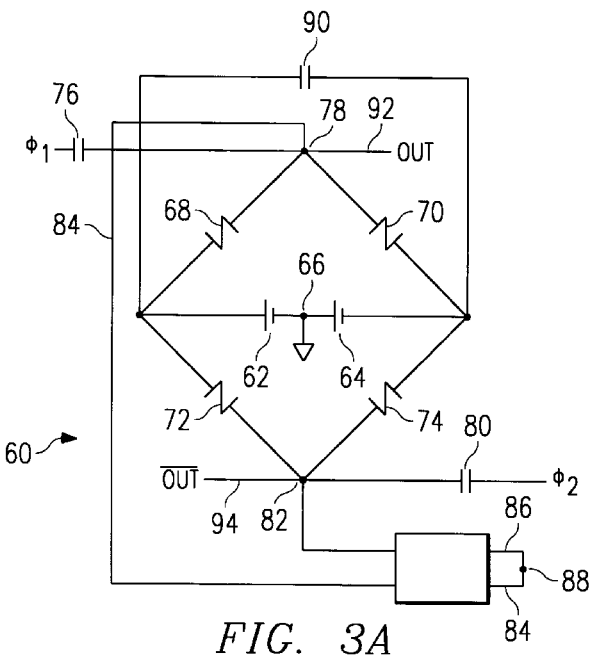
FIG. 3A is a schematic diagram of a third clock signal generator circuit constructed in accordance with the present invention.

Referring to FIG. 3A, a third clock signal generator circuit 60 is shown. Circuit 60 is similar in many respects to circuits 10 and 30 shown in FIGS. 1 and 2. Circuit 60 includes two DC power sources 62 and 64 connected in series. Between power sources 62 and 64 is a node 66 which is grounded. A first pair of RTDs 68 and 70 are connected in parallel with power sources 62 and 64. A second pair of RTDs 72 and 74 are also connected in parallel with power sources 62 and 64.

A first capacitor 76 transmits an oscillating input signal $\phi_1$ to a node 78 between RTDs 68 and 70. Likewise, a second capacitor 80 transmits an oscillating input signal $\phi_2$ to a node 82 between RTDs 72 and 74. Input signals $\phi_1$ and $\phi_1$ are constant-frequency oscillating signals and are 180° out of phase.

A first shielded transmission line 84 is connected to node 78, and a second shielded transmission line 86 is connected to node 82. Transmission lines 84 and 86 are equal in length and are connected at node 88. Node 88 may be grounded to provide inverted signal reflections along each transmission line 84 and 86. Alternatively, node 88 may be floating, in which case impulses transmitted along transmission line 86 are transmitted back along transmission line 84, and vice versa. Because input signals $\phi_1$ and $\phi_2$ are 180° out of phase, impulses of opposite polarity are transmitted simultaneously down transmission lines 84 and 86. These impulses cross at node 88, creating the equivalent of inverted signal reflections at node 88.

Together, power sources 62 and 64, RTDs 68 and 70, capacitor 76 and transmission line 84 comprise a single circuit very similar to circuit 10 shown in FIG. 1. Likewise, power sources 62 and 64, RTDs 72 and 74, capacitor 80 and transmission line 86 comprise another such circuit with the same components. RTDs 68 and 70 alternate between their two stable states at a frequency determined by input signal $\phi_1$, producing a square wave output (OUT) on output line 92. Likewise, RTDs 72 and 74 alternate between their two stable states at a frequency determined by input signal $\phi_2$, which is the same as the frequency of input signal $\phi_1$, producing a complementary square wave output ($\overline{OUT}$) on output line 94.

A bridge capacitor 90 is connected between the terminals of power sources 62 and 64. Bridge capacitor 90 provides the capacity for rapid current changes across RTDs 68, 70, 72 and 74. These current changes would otherwise be choked off by the high impedance of power sources 62 and 64, thereby damping the oscillation of circuit 60.

Figure 3C:
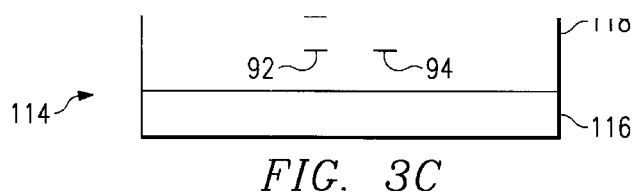
FIG. 3C is an exemplary cross section of a coupled waveguide used in the track-and-hold circuit.
Figure 3B:
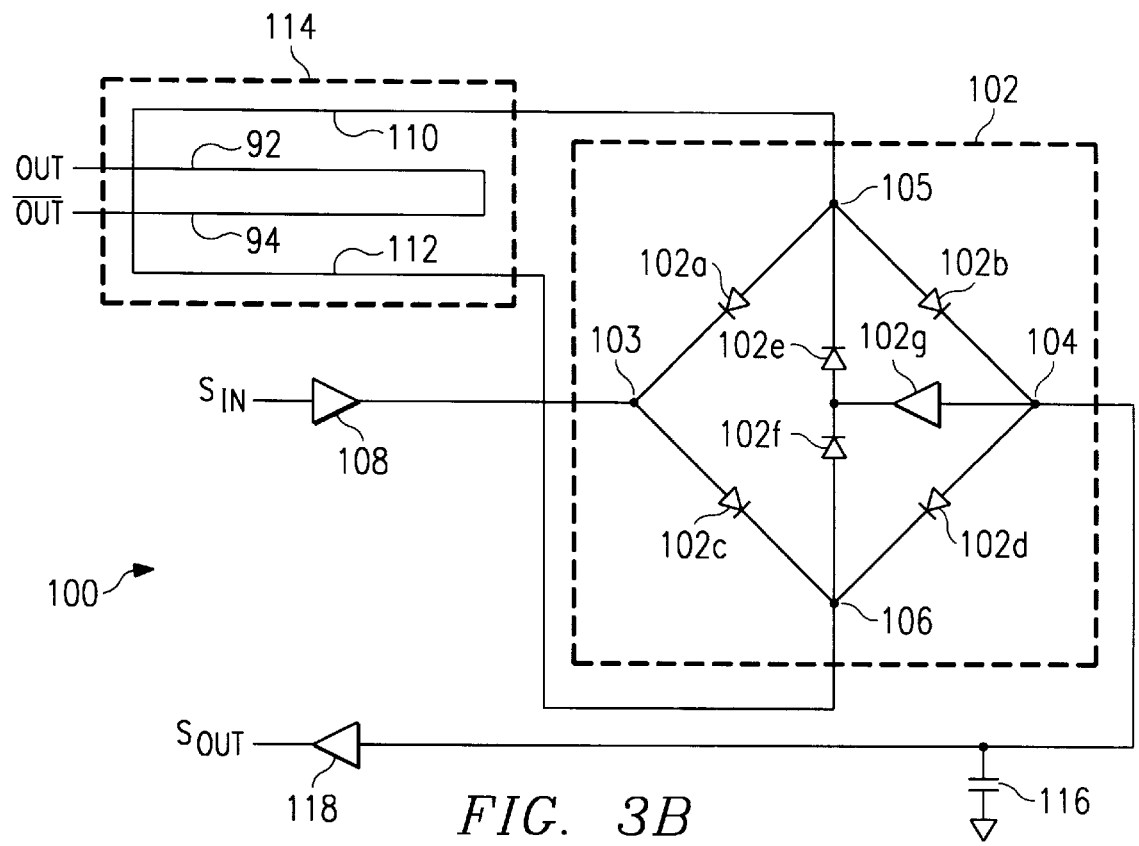
FIG. 3B is a schematic diagram of a track-and-hold circuit adapted to utilize the output of the third clock signal generator circuit.
Figure 3C:
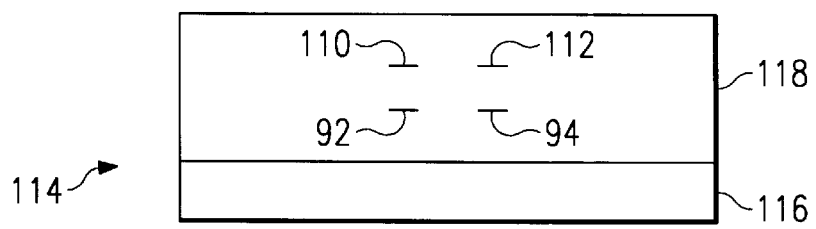

Referring to FIG. 3B, a track-and-hold circuit 100 adapted to utilize the output of clock signal generator circuit 60 is shown. Circuit 100 comprises a diode bridge 102 used to track and hold an input signal $S_{IN}$. Diode bridge 102 comprises an input node 103, an output node 104, and first and second bias nodes 105 and 106. First and second diodes 102a and 102b have anodes connected to first bias node 105 and cathodes connected to input node 103 and output node 104, respectively. Third and fourth diodes 102c and 102d have cathodes connected to second bias node 106 and anodes connected to input node 103 and output node 104, respectively.

Input signal $S_{IN}$ is buffered into input node 103 of diode bridge 102 by an input buffer 108. As is well known in the art of signal sampling, the potential at output node 104 tracks the potential at input node 103 when the diodes 102a–d of diode bridge 102 are conducting current in the forward direction. The potential at output node 104 ceases to track the potential at input node 103 when diodes 102a–d of diode bridge 102 are back-biased. Diodes 102e and 102f and buffer 102g improve the linearity and impedance characteristics of diode bridge 102.

Input lines 110 and 112, coupled to bias nodes 105 and 106, respectively, provide rapid switching between forward and backward bias across diode bridge 102. Input lines 110 and 112 are preferably coupled to output lines 92 and 94 of clock signal generator circuit 60 in a coupled waveguide 114.

Referring to FIG. 3C, an exemplary cross section of coupled waveguide 114 is shown. Coupled waveguide 114 comprises a substrate 116 and an insulator layer 118. Within insulator layer 118, output lines 92 and 94 of circuit 60 are physically aligned with input lines 110 and 112, respectively, of circuit 100. Each input line 110 and 112 is separated from its respective output line 92 and 94 by, for example, one micron along the entire length of coupled waveguide 114.

Returning to FIG. 3B, input lines 110 and 112 inductively receive the complementary high-frequency square-wave signals from their respective output lines 92 and 94 by virtue of their proximity thereto in coupled waveguide 114. Input lines 110 and 112 therefore alternate between forward bias and back bias across diode bridge 102. During the forward bias phase, known as a "track" phase, input lines 110 and 112 act as a current source and a current sink, respectively, and output node 104 tracks input node 103, charging up a holding capacitor 116. During the back bias phase, known as a "hold" phase, output node 104 does not track input node 103, but is held at a constant potential by holding capacitor 116. The signal created at output node 104 by diode bridge 102 is buffered by an output buffer 118 to become a sample output signal $S_{OUT}$.

Track-and-hold circuit 100 may be used as part of an analog-to-digital converter, with the sample output signal $S_{OUT}$ being used to digitize the input signal $S_{IN}$. Other uses for track-and-hold circuit 100 will be appreciated by those skilled in the art of signal processing. Because of the high-frequency capability of clock signal generator circuit 60, track-and-hold circuit 100 may be used in applications where high sampling frequencies, such as 25 GHz, are required.

While the invention has been particularly shown and described by the foregoing detailed description, it will be understood by those skilled in the art that various other changes in form and detail may be made without departing from the spirit and scope of the invention.

What is claimed is:

1. A clock signal generator comprising:
   a power supply having first and second terminals;
   a first resonant tunneling diode having first and second terminals, the first terminal of the first resonant tunneling diode being coupled to the first terminal of the power supply, the second terminal of the first resonant tunneling diode being coupled to an output node;
   a second resonant tunneling diode having first and second terminals, the first terminal of the second resonant tunneling diode being coupled to the output node, the second terminal of the second resonant tunneling diode being coupled to the second terminal of the power supply;
   a third resonant tunneling diode having first and second terminals, the first terminal of the third resonant tunneling diode being coupled to the first terminal of the power supply, the second terminal of the third resonant tunneling diode being coupled to a complementary output node;
   a fourth resonant tunneling diode having first and second terminals, the first terminal of the fourth resonant tunneling diode being coupled to the complementary output node, the second terminal of the fourth resonant tunneling diode being coupled to the second terminal of the power supply;
   a first signal source coupled to the output node and operable to periodically switch the first and second resonant tunneling diodes between a first state and a second state; and
   a second signal source coupled to the complementary output node and operable to periodically switch the third and fourth resonant tunneling diodes between a first state and a second state, the second signal source being out of phase with the first signal source.

2. The clock signal generator of claim 1, wherein the first signal source comprises:
   a first oscillating signal generator coupled to the output node of the clock signal generator and operable to produce a first oscillating input signal; and
   a first transmission line coupled to the output node of the clock signal generator, the first transmission line being operable to reflect the first oscillating input signal.

3. The clock signal generator of claim 2, wherein the first transmission line has a length approximately equal to one-quarter of a wavelength of the first oscillating input signal.

4. The clock signal generator of claim 2, wherein the first transmission line has a length approximately equal to an odd integer multiple of one-quarter of a wavelength of the first oscillating input signal.

5. The clock signal generator of claim 2, wherein the first transmission line comprises a grounded terminus.

6. The clock signal generator of claim 1, wherein the second signal source comprises:
   a second oscillating signal generator coupled to the complementary clock output node and operable to produce [an] a second oscillating input signal; and
   a second transmission line coupled to the complementary clock output node, the second transmission line being operable to reflect the second oscillating input signal.

7. The clock signal generator of claim 6, wherein the second transmission line comprises a grounded terminus.

8. A signal sampling system comprising:
   a power supply having first and second terminals;
   a first resonant tunneling diode having first and second terminals, the first terminal of the first resonant tunneling diode being coupled to the first terminal of the power supply, the second terminal of the first resonant tunneling diode being coupled to a clock output node;
   a second resonant tunneling diode having first and second terminals, the first terminal of the second resonant tunneling diode being coupled to the clock output node, the second terminal of the second resonant tunneling diode being coupled to the second terminal of the power supply;
   a third resonant tunneling diode having first and second terminals, the first terminal of the third resonant tunneling diode being coupled to the first terminal of the power supply, the second terminal of the third resonant tunneling diode being coupled to a complementary clock output node;
   a fourth resonant tunneling diode having first and second terminals, the first terminal of the fourth resonant tunneling diode being coupled to the complementary clock output node, the second terminal of the fourth resonant tunneling diode being coupled to the second terminal of the power supply;
   a first signal source coupled to the clock output node and operable to periodically switch the first and second resonant tunneling diodes between a first state and a second state, the first signal source comprising a first oscillating signal generator coupled to the clock output node and operable to produce a first oscillating input signal and a first transmission line coupled to the clock output node, the first transmission line being operable to reflect the first oscillating input signal;
   a track-and-hold circuit having a first bias node coupled to the clock output node, and having an input node operable to receive an input signal, and having an output node, the track-and-hold circuit being operable to track the input signal at the output node in response to the first and second resonant tunneling diodes being in the first state, and operable to hold a constant potential at the output node in response to the first and second resonant tunnel ing diodes being in the second state; and a second signal source coupled to the complementary clock output node and coupled to a second bias node of the track-and-hold circuit, the second signal source being operable to periodically switch the third and fourth resonant tunneling diodes between the first state and the second state, the second signal source being out of phase with the first signal source.

9. The signal sampling system of claim 8, wherein the first transmission line has a length approximately equal to one-quarter of a wavelength of the first oscillating input signal.

10. The signal sampling system of claim 8, wherein the second signal source comprises:
a second oscillating signal generator coupled to the complementary clock output node and operable to produce a second oscillating input signal out of phase with the first oscillating input signal; and
a second transmission line coupled to the complementary clock output node, the second transmission line being operable to reflect the second oscillating input signal.

11. The signal sampling system of claim 8, wherein the track-and-hold circuit further comprises:
a first diode having an anode coupled to the clock output node, and having a cathode coupled to the input node of the track-and-hold circuit;
a second diode having an anode coupled to the clock output node, and having a cathode coupled to the output node of the track-and-hold circuit;
a third diode having an anode coupled to the input node of the track-and-hold circuit, and having a cathode coupled to the complementary clock output node; and
a fourth diode having an anode coupled to the output node of the track-and-hold circuit, and having a cathode coupled to the complementary clock output node.

12. The signal sampling system of claim 11, wherein the track-and-hold circuit further comprises a holding capacitor coupled to the output node of the track-and-hold circuit.

13. The signal sampling system of claim 11, further comprising a coupled waveguide coupling the first bias node of the track-and-hold circuit to the transmission line of the first signal source.

14. A method for generating a clock signal, comprising the steps of:
connecting a first resonant tunneling diode to an output node;
connecting a second resonant tunneling diode to the output node;
applying an approximately constant DC voltage across the first and second resonant tunneling diodes;
applying a first periodic voltage fluctuation to the output node;
transmitting the first periodic voltage fluctuation on a first transmission line connected to the output node;
receiving a reflection of the first periodic voltage fluctuation from the transmission line at the output node;
periodically switching the output node between a first state and a second state in response to the first periodic voltage fluctuation, thereby generating the clock signal at the output node;
connecting a third resonant tunneling diode to a complementary output node;
connecting a fourth resonant tunneling diode to the complementary output node;
applying the approximately constant DC voltage across the third and fourth resonant tunneling diodes;
applying a second periodic voltage fluctuation out of phase with the first periodic voltage fluctuation to the complementary output node;
transmitting the second periodic voltage fluctuation on a second transmission line connected to the complementary output node;
receiving a reflection of the second periodic voltage fluctuation from the second transmission line at the complementary output node; and
periodically switching the complementary output node between a first state and a second state in response to the second periodic voltage fluctuation, thereby generating a complementary clock signal at the complementary output node.

15. The method of claim 14, further comprising the step of connecting a terminus of the first transmission line to a terminus of the second transmission line.

* * * * *

UNITED STATES PATENT AND TRADEMARK OFFICE
CERTIFICATE OF CORRECTION

PATENT NO.    : 6,037,819        Page 1 of 1
DATED         : March 14, 2000
INVENTOR(S)   : Tom P. E. Broekaert It is certified that error appears in the above-identified patent and that said Letters Patent is hereby corrected as shown below:

<u>Column 1,</u>
After line 6, insert the following paragraph:
-- This invention was made with Government support under contract N66001-96-C-8620 awarded by DARPA. The Government has certain rights in this invention. --.

Signed and Sealed this

Seventh Day of October, 2003

JAMES E. ROGAN
*Director of the United States Patent and Trademark Office*